United States Patent
Nakamura

(10) Patent No.: US 6,745,216 B1
(45) Date of Patent: Jun. 1, 2004

(54) SHIFT REGISTER ALLOWING DIRECT DATA INSERTION

(75) Inventor: Mitsuyuki Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 489 days.

(21) Appl. No.: 09/696,027

(22) Filed: Oct. 26, 2000

(30) Foreign Application Priority Data

Oct. 29, 1999 (JP) .......................................... 11/309579

(51) Int. Cl.⁷ .............................................. G06F 15/00
(52) U.S. Cl. ................................................... 708/209
(58) Field of Search ............................... 708/250, 252, 708/525, 209, 168; 716/18; 714/726; 360/40

(56) References Cited

U.S. PATENT DOCUMENTS

| | | | |
|---|---|---|---|
| 4,528,647 A | | 7/1985 | Chamberlain |
| 4,974,184 A | * | 11/1990 | Avra .......................... 708/252 |
| 5,327,543 A | * | 7/1994 | Miura et al. ................ 708/209 |
| 5,555,202 A | * | 9/1996 | Chu .......................... 708/209 |
| 5,903,466 A | * | 5/1999 | Beausang et al. ............. 716/18 |
| 5,983,376 A | * | 11/1999 | Narayanan et al. ......... 714/726 |
| 6,009,451 A | * | 12/1999 | Burns ........................ 708/525 |
| 6,317,763 B1 | * | 11/2001 | Vatinel ....................... 708/209 |
| 6,384,996 B1 | * | 5/2002 | Kim ............................. 360/40 |

FOREIGN PATENT DOCUMENTS

| | | |
|---|---|---|
| JP | 56-131243 | 10/1981 |
| JP | 6-350933 | 12/1994 |
| WO | WO 98/56005 | 12/1998 |

* cited by examiner

*Primary Examiner*—Todd Ingberg
*Assistant Examiner*—Chat Do
(74) *Attorney, Agent, or Firm*—Whitham, Curtis & Christofferson, PC

(57) ABSTRACT

A shift register allowing high-speed data insertion into a string of data with a relatively simple hardware-like configuration is disclosed. A plurality of register units connected in series, each of the register units having a direct input port which is selected for direct data input only when the register unit is designated. The register units are controlled such that a desired register unit is designated to store direct data and all downstream register units starting from the designated register unit shift their data to respective ones of next stages

2 Claims, 6 Drawing Sheets

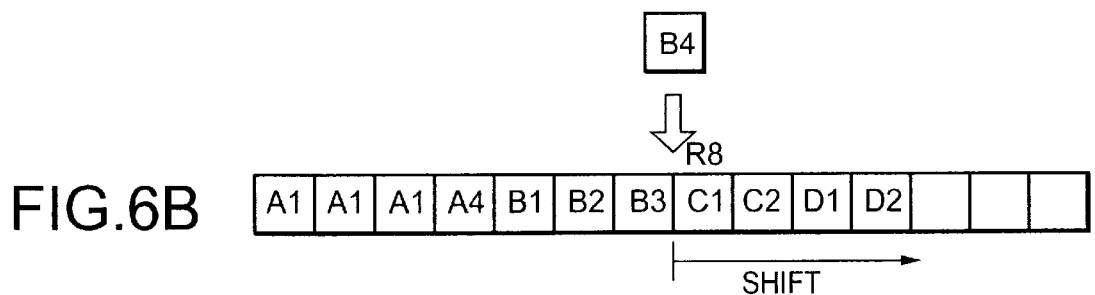

SHIFT REGISTER ALLOWING DIRECT DATA INSERTION

BACKGROUND OF THE INVENTION

1. Field of the Invention

The present invention relates to a shift register having a plurality of register units connected in series. In particular, the invention relates to a shift register allowing high-speed data processing such as data insertion and other data processing, as well as to a control method of such a shift register.

2. Description of the Prior Art

Shift registers are used for processing of a data string in various electronic circuits. In communication devices, for example, processing of a data string is needed when it is desired to insert prescribed data or rearrange data so that they will be arranged in proper order, that is, in order of time or addresses.

Japanese Patent Application Laid-Open No. 56-131243 discloses a technique for that purpose in which a sync control signal composed of a plurality of bits is inserted into a digital signal data string by using a shift register and other circuit elements.

Conventionally, a data string processing function is realized by processing data in a software-like manner. For example, in the case of inserting data into a data string, a program is used, which shifts all data following a position where new data is to be inserted one by one and then inserts the new data at the resulting empty location.

Japanese Patent Application Laid-Open No. 6-350933 discloses a technique of starting a scanning from an arbitrary position in a shift register and stopping the scan at another arbitrary position, though the purpose of this technique is different from that of the present invention.

The above-described conventional data processing or constructing methods have a problem that considerable time is needed to insert even a single piece of data into an existing data string.

SUMMARY OF THE INVENTION

An object of the present invention is to provide a shift register capable of performing, with a relatively simple hardware-like configuration, such processing as data insertion much faster and more easily than in the conventional case of using software processing, as well as to a data inserting method using such a shift register and a control method of the shift register.

According to the present invention, a shift register includes: a plurality of register units connected in series, each of the register units having a direct input port which is selected for direct data input only when the register unit is designated; and a controller controlling the register units such that a desired register unit is designated to store direct data and all downstream register units starting from the designated register unit shift their data to respective ones of next stages.

According to an aspect of the present invention, a shift register includes: a plurality of register units connected in series, each of the register units comprises: an input selector for selecting one of first input data received from a previous stage and second input data received from a data bus, depending on a selection signal; and a storage element for storing and outputting the selected data to a next stage depending on a shift clock signal; and a controller controlling the selection signal and the shift clock signal such that only a designated register unit inputs the second input data from the data bus and only downstream register units starting from the designated register unit shift their data to respective ones of next stages.

According to another aspect of the present invention, a shift register includes: n (n>1) register units connected in series, each of the register units comprises: m (m>1) input selectors for selecting respective bits of first m-bit input data received from a previous stage and second m-bit input data received from a m-bit data bus, depending on a selection signal; and m storage elements for storing and outputting the selected m-bit data to a next stage depending on a shift clock signal; and a controller controlling the selection signal and the shift clock signal such that only a designated register unit inputs the second m-bit input data from the m-bit data bus and only downstream register units starting from the designated register unit shift their m-bit data to respective ones of next stages.

The controller may include: a shift position designator for generating the selection signal to a designated one of the register units depending on shift position designation data; and a shift clock generator for supplying the shift clock signal to each of the all downstream register units starting from the designated register unit.

According to the present invention, a data inserting method includes the steps of: a) storing an original string of data in a shift register having a plurality of register units connected in series, each of the register units having a direct input port for input of insertion data to be inserted; b) designating a desired one of the register units to cause the direct input port of the designated register unit to be active; c) shifting original data stored in all downstream register units starting from the designated register unit to respective ones of next stages; and d) inputting the insertion data in the designated register unit through the direct input port thereof, to produce a new string of data having the insertion data inserted therein.

The steps (c) and (d) may be performed in synchronization with each other.

According to further another aspect of the present invention, a control method of a shift register comprising a plurality of register units connected in series, each of the register units having a direct input port which is selected for direct data input only when the register unit is designated, includes the steps of: a) designating one of the register units depending on shift position designation data; and b) supplying a shift clock signal to each of all downstream register units starting from the designated register unit.

Each of the register units may include an input selector for selecting one of first input data received from a previous stage and second input data received from a data bus, depending on a selection signal; and a storage element for storing and outputting the selected data to a next stage depending on a shift clock signal. The step (a) may be the step of generating the selection signal to a designated one of the register units depending on shift position designation data. The step (b) may be the step of supplying the shift clock signal to each of the all downstream register units starting from the designated register unit.

Each of the register units may include; m (m>1) input selectors for selecting respective bits of first m-bit input data received from a previous stage and second m-bit input data received from a m-bit data bus, depending on a selection signal; and m storage elements for storing and outputting the selected m-bit data to a next stage depending on a shift clock signal. The step (a) may be The step of generating the selection signal to a designated one of the register units depending on shift position designation data. The step (b) may be the step of supplying the shift clock signal to each of the all downstream register units starting from the designated register unit.

As described above, according to the present invention, in a state that a data string arranged in certain order is set in the shift register, desired data can be inputted to a desired register unit while sequentially shifting existing data to a subsequent register unit. Therefore, a manipulation such as inserting desired data into the data string at an arbitrary position can be performed simply at high speed on hardware.

BRIEF DESCRIPTION OF THE DRAWINGS

FIGS. 6A–6C illustrate a data insertion operation of the shift register according to the second embodiment of the present invention.

DETAILED DESCRIPTION OF THE PREFERRED EMBODIMENTS

The present invention will be hereinafter described in detail with reference to the accompanying drawings.

Figure 1:
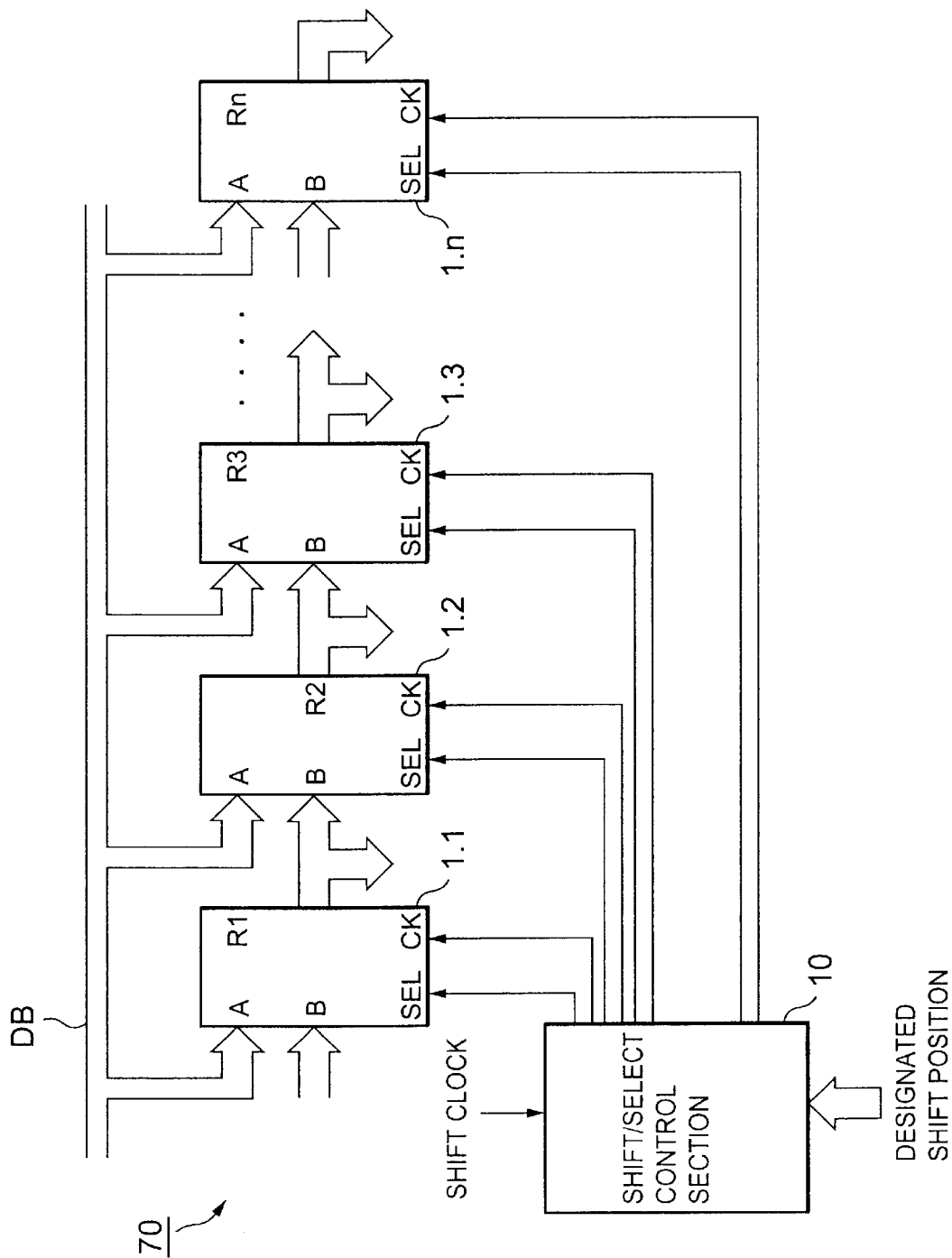
FIG. 1 is a block diagram showing a general circuit configuration of a shift register according to the present invention.

Referring to FIG. 1, an n-stage shift register 70 is composed of a plurality of register units 1.1 through 1.n connected in series (or in cascade) and a shift/select control section 10 that controls the register units 1.1–1.n. The register units 1.1–1.n are also indicated by reference symbols R1–Rn.

Each of the register units 1.1–1.n inputs selectively data from the preceding register unit connected to an input terminal or port B thereof and a data bus DB connected to an input terminal or port A thereof. Which of the data supplied to the input terminals A and B should be received at a register unit is determined depending on the state of a selection signal SEL that is supplied from the shift/select control section 10.

Each register unit captures input data in synchronism with a shift clock signal (CK) that is supplied from the shift/select control section 10 and outputs the captured data to the next register unit. Needless to say, when every register unit is so set as to receive output data of the preceding register unit, the shift register 70 as a whole shifts data in synchronism with CK signals like a conventional shift register.

The CK signals that are supplied to the respective register units 1.1–1.n are obtained by the shift/select control section 10 processing a clock pulse that is received from an external shift clock generator. The respective CK signals are applied independently to the register units 1.1–1.n. To shift data merely, it is sufficient to supply the CK signals to all the register units 1.1–1.n with the same timing.

By using a clock means that is composed of the clock generator and the shift/select control section 10 as described above, CK signals or shift clock signals can be supplied to a desired consecutive sequence of ones in the registrar units 1.1–1.n. For example, one register unit that should perform an operation of capturing data on the data bus DB and register units downstream thereof can be supplied with CK signals.

Figure 2:
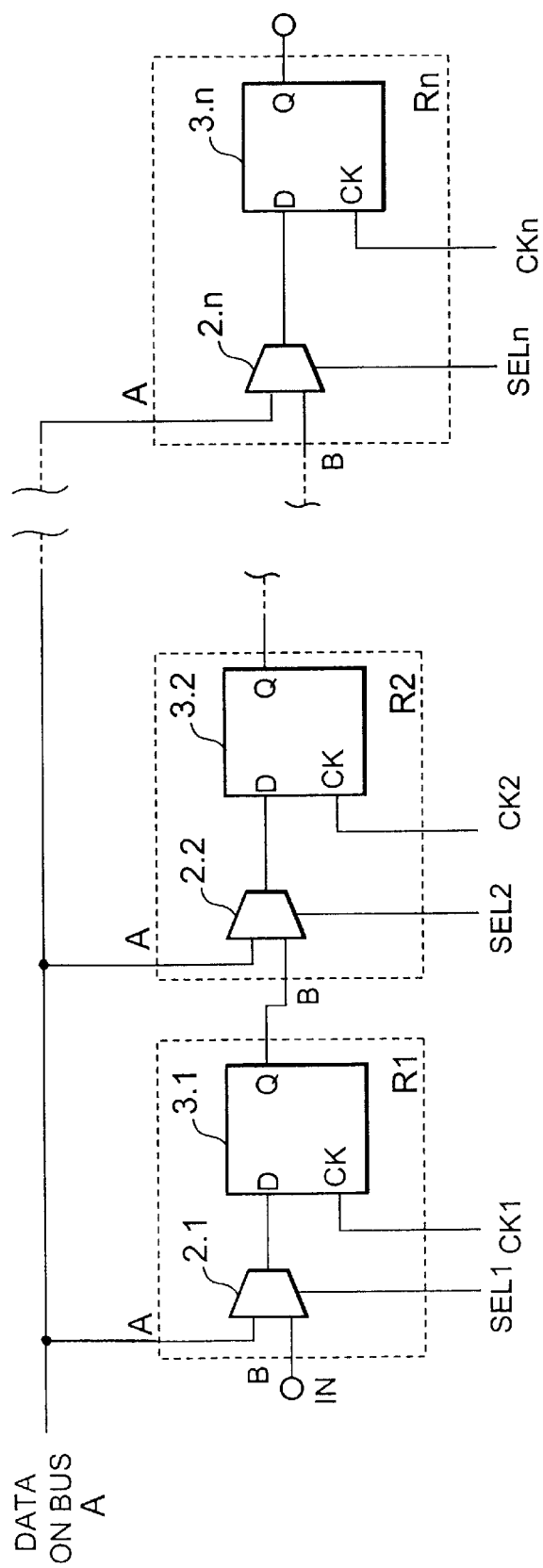
FIG. 2 is a circuit diagram showing a register unit section of the shift register according to a first embodiment of the present invention.

An n-stage shift register according to a first embodiment of the present invention will be described hereafter Referring to FIG. 2, a shift register unit section consists of n selectors 2.1–2.n and n D-type flip-flops (D-F/F'S) 3.1–3.n. A pair of a 6elector and a corresponding D-F/F constitutes each of the register units R1 to Rn. For example, the selector 2.1 and the D-F/F 3.1 form a register unit R1. In this manner, the register units R1 to Rn are connected in series to form n stages.

The selector 2.i of each register unit Ri (i=1, 2, ..., n) selects an A-input when a corresponding selection signal SEL1 is active, and a B-input when the selection signal SEL1 is inactive. At an instant when a corresponding CK signal CKi turns active, the D-F/F 3.i of each register unit Ri captures data (high/low voltage level at that time) that is selected by the selector 2.i and is applied to the D-input thereof at that time. This captured data is outputted from the Q-output thereof.

For example, the selector 2.1 selects the A-input data when the selection signal SEL1 is active, selects the B-input data (here, IN data) when the selection signal SEL1 is inactive, and outputs the selected data to the D-F/F 3.1. When the CK signal CK1 turns active, the D-F/F 3.1 captures the selected data that is input from the selector 2.i and is applied to the D-input thereof at that time. This captured data is outputted from the Q-output thereof to the following stage, that is, the register unit R2. It is the same with other register units R2–Rn.

Figure 3:
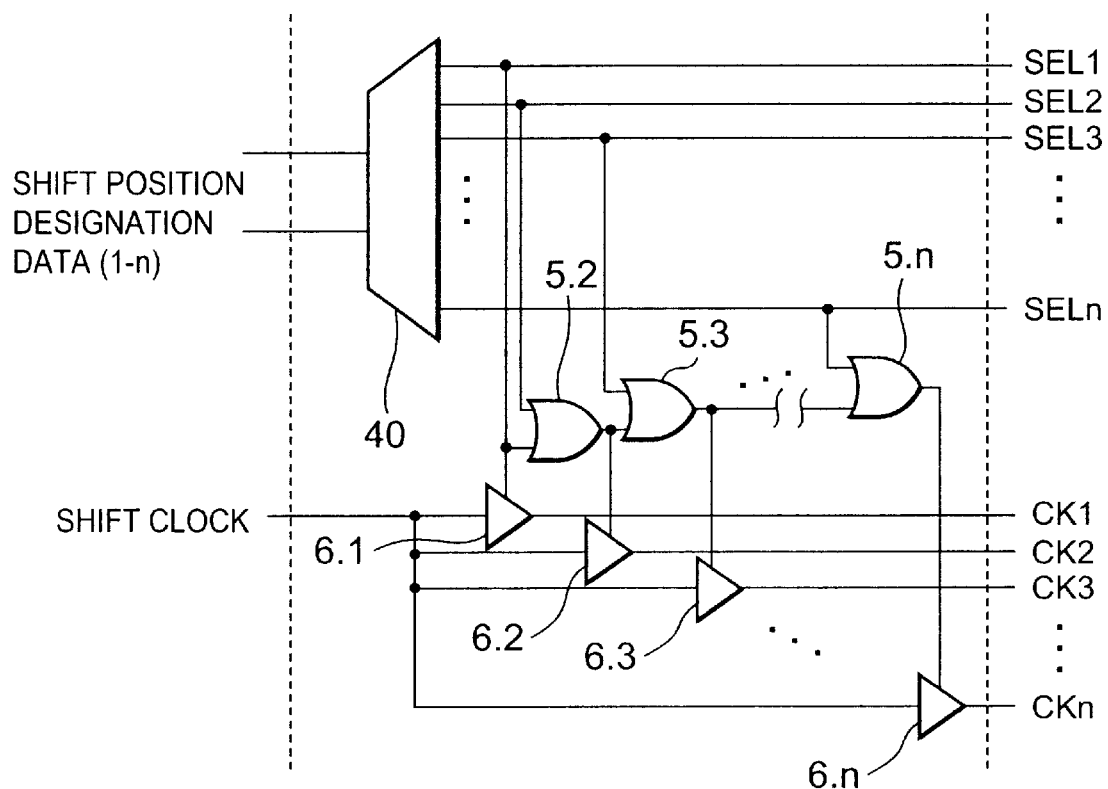
FIG. 3 is a circuit diagram showing an example of a shift/select control section of the shift register according to the present invention.

Referring to FIG. 3, the shift/select control section 10 is provided with a line decoder 40 that decodes shift position designation data to make only a designated one of the selections signals SEL1–SELn active. The shift/select control section 10 uses the selections signals SEL1–SELn to instruct only a designated register unit Rx ($1 \leq x \leq n$) to select the A-input data on the data bus DB and the other register units to select the B-input data received from the preceding stage.

The shift/select control section 10 is further provided with (n−1) OR gates 5.2 through 5.n and n enable buffers 6.1 through 6.n, which are designed to supply one or more designated ones of the CK signals CK1–CKn to corresponding one or more register unit. More specifically, when a register unit Rx is designated by making only the selection signal SELx active, the shift/select control section 10 outputs CK signals CKx through CKn to the register units Rx through Rn, respectively. In other words, the designated register unit Rx and the following register units $R_{x+1}$ through Rn downstream thereof are supplied with the same CK signal while the register units R1 through $R_{x-1}$ upstream thereof are not supplied.

As described above, when receiving the shift position designation data (binary signal) for designating α shift position in a range of 1 to n, the line decoder 40 decodes it to make one of selection signals SEL1 to SELn active. As is well known, each of the OR gates 5.2–5.n is a logical circuit in which the output is active when at least one of the two inputs is active. Therefore, in this embodiment, when a certain selection signal SEL is active, the output of a corresponding OR gate that receives the selection signal SEL and the outputs of all the OR gates downstream thereof are active.

The selection signal SEL1 and the outputs of the OR circuits 5.2–5.n, as shown in FIG. 3, are connected to the enable input terminal of the enable buffer 6.1 and the enable input terminals of the enable buffers 6.2–6.n, respectively. Each of the enable butters 6.1–6.n is a logic element which outputs the shift clock signal received from the external clock generator to a corresponding register unit when receiving an active signal at the enable input terminal thereof.

Accordingly, as described above, when a selection signal SELx ($1 \leq x \leq n$) is active, the enable inputs of an enable buffer 6.x and all the consecutive enable buffers 6.x+1–6.n downstream thereof are active, causing the shift clock signal to be supplied as clock signals CKx–CKn to respective ones of the register units Rx–Rn.

In the above-described manner, the shift/select control section 10 outputs a selection signal SEL having such a polarity as to cause only one register unit to select the A-input (data bus side) data to the designated register unit. Accordingly, only the designated register unit captures the data on the data bus DB. Furthers, the shift/select control section 10 suppliers shift clock signals to the designated register unit and all the register units downstream thereof, so that the existing data of the designated register unit and all the register units downstream thereof are shifted and the data on the data bus DB are inserted thereto.

With the above circuit configuration, only a particular register unit is designated by the shift position designation data selects the data-bus-side input. Then the shift clock signals turn active, the particular register unit captures data on the data bus DB, and each of the register units downstream thereof captures output data of the preceding register unit (shift operation). Therefore, in the case where a data string arranged in certain order is set in the shift register 70, a process of inserting arbitrary data (bit) at a desired position can be executed easily with hardware at high speed. That is, an input process of inputting desired data in an arbitrary register unit and a shifting process of shifting the data set in the arbitrary register unit to the register units downstream thereof can be achieved easily and speedily.

For example, the shift register 70 of this embodiment can be used in the case of inserting a particular serial code into a prescribed position of serial data, which will be described with reference to FIGS. 4A–4E.

Figure 4A:
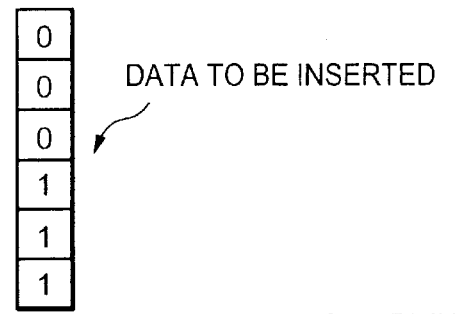
FIGS. 4A–4E illustrate a data insertion operation of the shift register according to the first embodiment of the present invention.
Figure 4B:
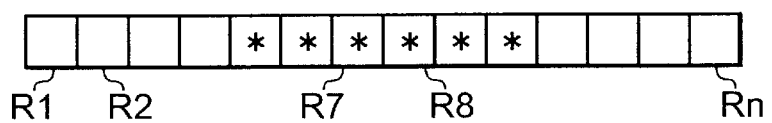

As shown in FIG. 4A, it is assumed that 6-bit consecutive data "111000" to be inserted appears bit by bit on the data bus DB. It is further assumed, as shown in FIG. 4B, that a data string is stored in the register units R1–Rn of the shift register 70 as indicated by marks "★".

A description will be made of a case inserting the 6-bit consecutive data "1110000" between two bits of data stored in the register units R7 and R8. In this case, the shift position designation data is binary "8", which designates the register unit R8. Therefore, only the selection signal SEL8 becomes active and thereby the selector 2.8 of the register unit R8 selects the A-input data, that is, data on the data bus DB.

Figure 4C:
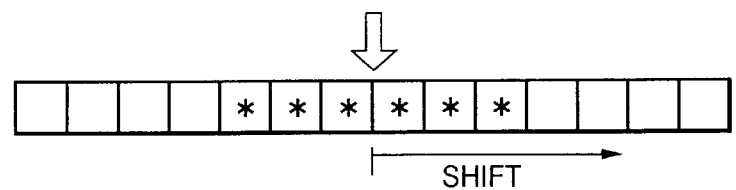
Figure 4D:
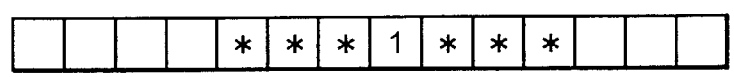

When the selection signal SEL8 becomes active, the enable buffers 6.8 to 6.n all become active to output the shift clock signal as clock signals CK8–CKn to the register units R8–Rn. Therefore, as shown in FIG. 4C, the respective bits stored in the register units R8–Rn are shifted to the right by one stage as indicated by the shift arrow. At the same time, the first bit "1" is supplied to the data bus DB and the first bit "1" is stored in the designated register unit R8 in synchronism with the shift clock signal CK8 as shown in FIG. 4D.

Figure 4E:
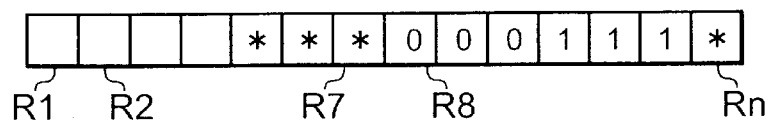

Similarly, the remaining data bits "11000" are sequentially input to the register unit R8 in this order while shifting in the direction of the shift arrow according to the shirt clock signal. In this manner, all the 6-bit data "111000" are stored in the register units R13 through P8 to form a data bit string having the 6-bit data inserted therein, as shown in FIG. 4E. The resulting data bit sting may be output in parallel or in series.

As described above, since desired data can be inserted into a desired position, a data string that are arranged in desired order can be formed using hardware at high speed.

Although not illustrated, desired data can also be inserted by performing shift operations for stages of a number that is equal to the number of data bits to be inserted and then inserting the data bits in parallel to the empty register units.

An n-stage shift register according to a second embodiment of the present invention will be described hereafter. In the second embodiment, the data bus DB is an m-bit bus ($m \geq 2$) and m-bit data is shifted through the n-stage shift register according to the selection signals SEL1–SELn and the shift clock signals CK1–CKn which are received from the shift/select control section 10. Similarly to the first embodiment, the n-stage shift register is composed of n register units R1–Rn which are each supplied with the selection signals SEL1–SELn and the shift clock signals CK1–CKn.

Figure 5:
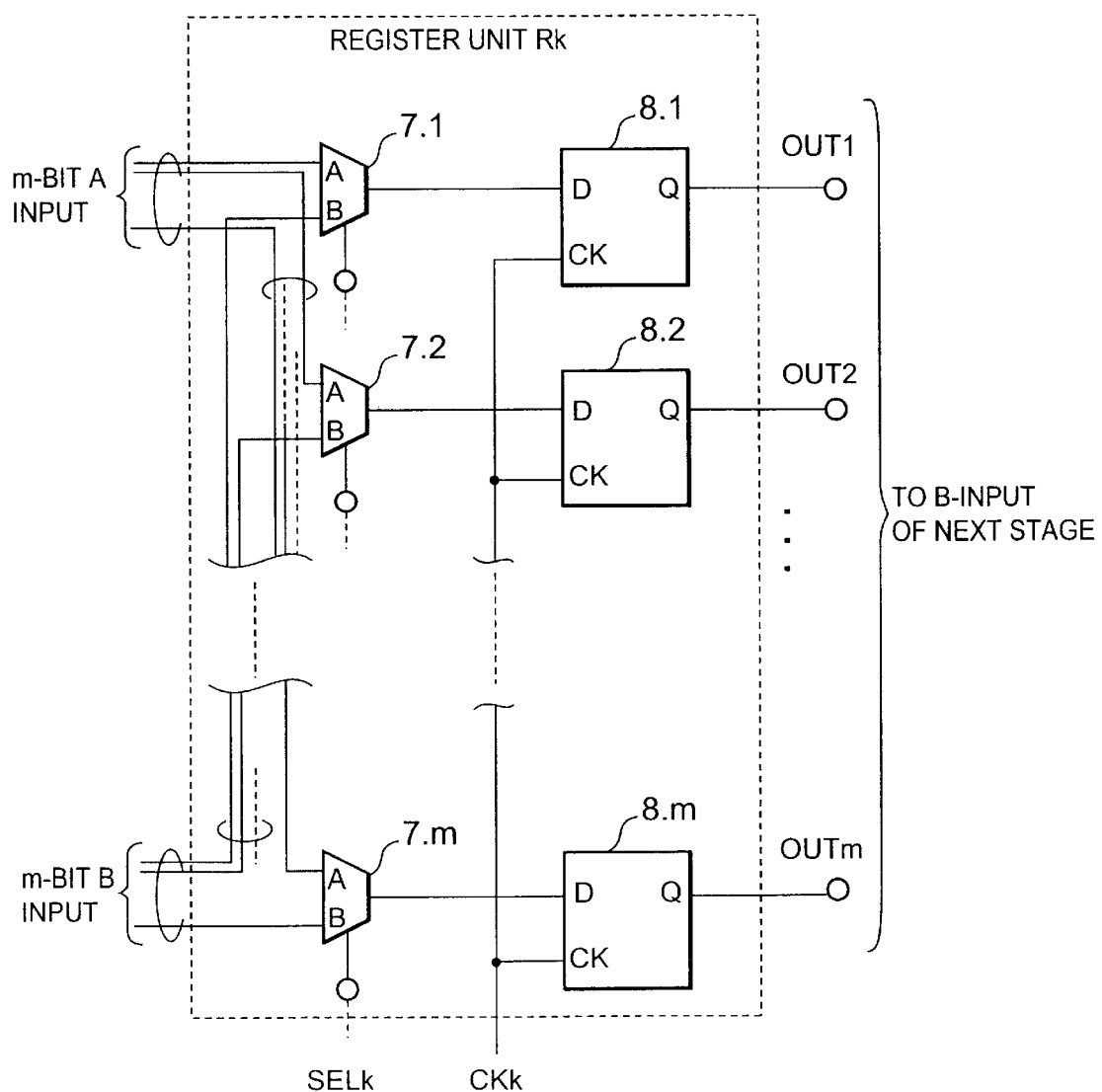
FIG. 5 is a circuit diagram showing a register unit of the shift register according to a second embodiment of the present invention.

Referring to FIG. 5, a register unit Rk (k–1, 2, . . . n) is composed of m selectors 7.1–7.m and m D-F/Fs 8.1–8.m. The m selectors 7.1–7.m receive the selection signal SELk in common from the shift/select control section 10. The m D-F/Fs 8.1–8.m receive the shift clock signal CKk in common from the shift/select control section 10.

A pair of selector 7.i and D-F/F 8.i corresponds to an 1-th bit of each of the m-bit A-input data and the m-bit B-input data. More specifically, the selector 7.1 inputs the first bit of the m-bit A-input data and the first bit of the m-bit B-input data and selects one of them depending on the selection signal SELk. The selector 7.1 selects the first bit of the m-bit A-input data when the selection signal SELk is active and selects the first bit of the m-bit B-input data when the selection signal SELk is inactive. The selected data is output to the D-F/F 8.1, which holds the selected data when the shift clock signal CKk turns active. Similarly, the selector 7.i inputs the i-th bit of the m-bit A-input data and the i-th bit of the m-bit B-input data and selects one of them depending on the selection signal SELk. The selector 7.i selects the 1-th bit of the m-bit A-input data only when the selection signal SELk is active and selects the i-th bit of the m-bit B-input data when the selection signal SELk is inactive. The selected data output to the D-F/F 8.i, which holds the selected data according to the shift clock signal CKk. In other words, at the register unit Rk, all the selectors 7.1–7.m operate according to the selection signal SELk and all the D-F/F 8.1–8.m operate according to the shift clock signal CKk.

Here, the m-bit A-input data is received from the data bus DB and the m-bit B-input data is received from the previous stage as shown in FIG. 1. The m-bit output data of the D-F/Fs 8.1–8.m are output to the next stage.

An operation of the shift register according Lo the second embodiment will be described below with reference to FIGS. 6A–6C.

Assume that there are m-bit data that can be classified into four main categories A, B, C, and D, and that each main category includes at least one m-bit data which is given respective numbers indicating order. In this example, also assume that data that are obtained one after another need to be arranged in order of A, B, C, and D and in ascending order of said numbers in the same main category.

Figure 6A:
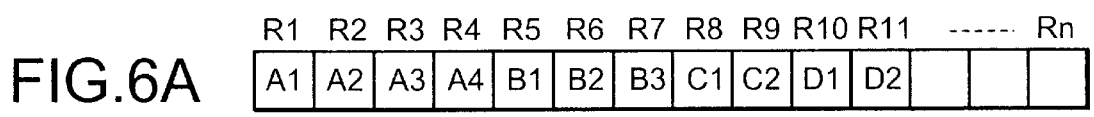
Figure 6C:
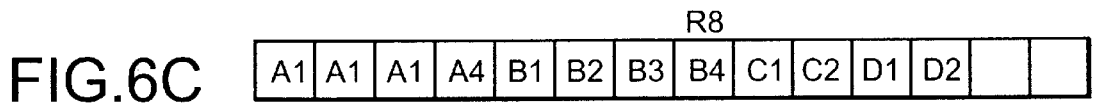

As shown in FIG. 6A, a sequence of m-bit data, A1, A2, ... B1, B2, ... is stored in the shift register as shown in FIG. 5 at a certain time point.

When data B4 has occurred as data to be added as shown in FIG. 6B, the data 54 should be inserted between data B3 and data C1 This can be attained by supplying the data B4 to the data bus DB, designating the eighth register unit R8 where the data C1 is stored, by using shift position designation data, and making shift clock signals CK8–CKn active. In this manner, as described in the first embodiment, the respective m-bit data stored in the register units R8–Rn are shifted to the right by one stage as indicated by the shift arrow. At the same time, the data B4 is stored in the designated register unit R8 in synchronism with the shift clock signal CK8 as shown in FIG. 6C.

In this manner, a plurality of m-bit data that are arranged in desired order can be formed by inserting desired m-bit date at an arbitrary position by hardware.

With the above-configured shift register according to the present invention, in a state that a data string arranged in certain order is set in the shift register, a manipulation such as inserting desired data into the data string at an arbitrary position can be performed simply at high speed on hardware by inputting desired data to a corresponding register unit and then sequentially shifting existing data to a subsequent register unit. In particular, the shift register according to the present invention is advantageous in that it has a simple configuration and is inexpensive.

What is claimed is:

1. A shift register comprising:
   a plurality of register units connected in series, wherein each of the register units comprises:
      an input selector for selecting one of first input data received from a previous stage and second input data received from a previous stage and second input data received from a data bus, depending on a selection signal; and
      a storage element for storing and outputting, the selected data to a next stage depending on a shift clock signal; and
   a controller controlling the selection signal and the shift clock signal to cause only a designated register unit to receive the second input data from the data bus and only downstream register units starting from the designated register unit to shift their data to respective ones of next stages, wherein the controller comprises:
      a shift position designator for supplying the selection signal to a designated one of the register units depending on the shift position designation data; and
      a shift clock generator for supplying the shift clock signal to each of the downstream units starting from the designated register unit.

2. A shift register comprising:
   n (n>1) register units connected in series, wherein each of the register units comprises:
   m (m>1) input selectors for selecting respective bits of first m-bit input data received from a previous stage and second m-bit input data received from a m-bit data bus, depending on a selection signal; and
   m storage elements for storing and outputting the selected m-bit data to a next stage depending on a shift clock signal; and
   a controller controlling the selection signal and the shift clock signal to cause only a designated register unit to receive the second m-bit input data from the m-bit data bus and only downstream register units starting from the designated register unit to shift their m-bit data to respective ones of next stages, wherein the controller comprises:
      a shift position designator for supplying the selection signal to a designated one of the register units depending on the shift position designation data; and
      a shift clock generator for supplying the shift clock signal to each of the downstream units starting from the designated register unit.

* * * * *